United States Patent
Strauch

(10) Patent No.: US 8,846,501 B2
(45) Date of Patent: Sep. 30, 2014

(54) METHOD FOR EQUIPPING AN EPITAXY REACTOR

(75) Inventor: Gerhard Karl Strauch, Aachen (DE)

(73) Assignee: Aixtron SE, Herzogenrath (DE)

( * ) Notice: Subject to any disclaimer, the term of this patent is extended or adjusted under 35 U.S.C. 154(b) by 0 days.

(21) Appl. No.: 13/378,340

(22) PCT Filed: Jun. 8, 2010

(86) PCT No.: PCT/EP2010/057976
§ 371 (c)(1),
(2), (4) Date: Dec. 14, 2011

(87) PCT Pub. No.: WO2010/145969
PCT Pub. Date: Dec. 23, 2010

(65) Prior Publication Data
US 2012/0094474 A1  Apr. 19, 2012

(30) Foreign Application Priority Data
Jun. 15, 2009 (DE) .......................... 10 2009 025 971

(51) Int. Cl.
| H01L 21/20 | (2006.01) |
| H01L 21/28 | (2006.01) |
| C30B 25/08 | (2006.01) |
| C30B 35/00 | (2006.01) |
| C23C 16/44 | (2006.01) |
| C23C 16/52 | (2006.01) |

(52) U.S. Cl.
CPC ................ *C30B 25/08* (2013.01); *C30B 35/00* (2013.01); *C23C 16/4404* (2013.01); *C23C 16/52* (2013.01)
USPC ........... 438/478; 438/604; 438/606; 438/607; 118/666; 118/728; 118/715

(58) Field of Classification Search
USPC .......... 438/478, 604, 606, 607; 118/666, 728, 118/715
See application file for complete search history.

(56) References Cited

U.S. PATENT DOCUMENTS

| 4,699,675 | A | * | 10/1987 | Longeway | 117/84 |
| 5,863,602 | A | | 1/1999 | Watanabe et al. | |
| 5,970,383 | A | | 10/1999 | Lee | |
| 6,071,797 | A | * | 6/2000 | Endo et al. | 438/488 |
| 6,451,686 | B1 | * | 9/2002 | Ngai et al. | 438/623 |
| 6,777,347 | B1 | | 8/2004 | Ni et al. | |
| 2002/0043338 | A1 | * | 4/2002 | Masuda et al. | 156/345 |
| 2005/0229855 | A1 | * | 10/2005 | Raaijmakers | 118/725 |
| 2006/0073683 | A1 | * | 4/2006 | Collins et al. | 438/510 |
| 2008/0053373 | A1 | | 3/2008 | Mund et al. | |
| 2008/0261074 | A1 | * | 10/2008 | Shishikura | 428/687 |
| 2009/0061092 | A1 | * | 3/2009 | Kameshima et al. | 427/255.394 |
| 2009/0068823 | A1 | * | 3/2009 | Hong et al. | 438/513 |
| 2009/0114921 | A1 | * | 5/2009 | Yamazaki et al. | 257/72 |

FOREIGN PATENT DOCUMENTS

| DE | 68908927 T2 | 3/1994 |
| DE | 102004035335 A1 | 2/2006 |
| DE | 102005055093 A1 | 12/2011 |
| WO | 2007/060143 A1 | 5/2007 |

OTHER PUBLICATIONS

Aixtron AG; PCT/EP2010/057976 filed Jun. 8, 2010; International Search Report and Written Opinion; ISR/EP; Oct. 7, 2010: 13 pages.
Aixtron SE; PCT/EP2010/057976 filed Jun. 8, 2010; International Preliminary Report on Patentability; Dec. 16, 2011; 7 pages.
EP Application No. 10722124.4; Aixtron SE; Request for Entry into the European Phase; Jan. 12, 2012; 25 pages.
EP Application No. 10722124.4; Aixtron SE; Communication from European Patent Office; Feb. 14, 2012; 2 pages.
EP Application No. 10722124.4; Aixtron SE; Communication from European Patent Office; Feb. 21, 2012; 2 pages.
EP Application No. 10722124.4; Aixtron SE; Amendments before Examination; Mar. 7, 2012, 5 pages.

* cited by examiner

*Primary Examiner* — Charles Garber
*Assistant Examiner* — Ron Pompey
(74) *Attorney, Agent, or Firm* — Ascenda Law Group, PC

(57) ABSTRACT

The invention relates to a method for equipping a process chamber in an apparatus for depositing at least one layer on a substrate held by a susceptor in the process chamber, process gases being introduced into the process chamber through a gas inlet element, in particular by means of a carrier gas, the process gases decomposing into decomposition products in the chamber, in particular on hot surfaces, the decomposition products comprising the components that form the layer. In order to improve the apparatus so that thick multi-layer structures can be deposited reproducibly in process steps that follow one another directly, it is proposed that a material is selected for the surface facing the process chamber at least of the wall of the process chamber that is opposite the susceptor, the optical reflectivity, optical absorptivity and optical transmissivity of which respectively correspond to those of the layer to be deposited during the layer growth.

7 Claims, No Drawings

METHOD FOR EQUIPPING AN EPITAXY REACTOR

CROSS REFERENCE TO RELATED APPLICATIONS

This is a NATIONAL STAGE under 35 USC 371 of and claims priority to International Application PCT/EP2010/057976, filed 8 Jun. 2010, incorporated herein by reference, which claims priority to DE 10 2009 025 971.6 filed 15 Jun. 2009.

BACKGROUND AND SUMMARY OF THE INVENTION

The invention relates to an apparatus for depositing layers on a substrate held by a susceptor in the process chamber, in which process gases are introduced into the process chamber through a gas inlet element, in particular by means of a carrier gas, the process gases decomposing into decomposition products in the chamber, in particular on hot surfaces, the decomposition products comprising the components that form the layer.

The invention relates to an apparatus for depositing layers on a [lacuna] by a susceptor, in which process gases are introduced into the process chamber through a gas inlet element, in particular by means of a carrier gas, the process gases decomposing into decomposition products in the chamber, in particular on hot surfaces, the decomposition products comprising the components that form the layer.

An epitaxy reactor is known from DE 689 08 927 T2, which has a process chamber that is of flat cylindrical form and is circular in plan view. The cover of the process chamber is formed by a cover plate, in the center of which there is a gas inlet element through which process gases are introduced into the process chamber. The base of the process chamber, which forms the susceptor, carries a multiplicity of substrates. The substrates lie in each case on substrate holders that are driven in rotation. The susceptor is heated from below. This can be effected by way of a resistance heater or by an RF heater.

An MOCVD process takes place in the process chamber. For this, organometallic compounds of Main Group III, e.g. TMGA or TMIn, are introduced into the process chamber by a carrier gas, e.g. hydrogen. A second process gas in the form of a hydride is introduced into the process chamber as a reaction partner for this first process gas. This may be $AsH_3$, $PH_3$ or $NH_3$.

On the substrates lying on the susceptor that is heated from beneath, e.g. GaAs, GaN, InP or mixed crystals, a layer consisting of elements of the Main Groups III and V is deposited. The process gases introduced into the process chamber decompose pyrolytically on the hot surfaces. This layer growth based on a pyrolytic pre-decomposition takes place naturally not only on the substrate surfaces, but also on the surfaces of the susceptor surrounding the substrates. Since the cover of the process chamber that is located opposite the susceptor is also heated by heat radiation emitted by the susceptor and cannot be cooled to a sufficient extent, a parasitic growth takes place there. Layers that are deposited on walls of the process chamber are fundamentally undesirable.

In the generic apparatus, the coating on the process chamber cover and on the susceptor is removed again, after the deposition of a thin semiconductor layer, by an etching of the process chamber that can be effected "in situ". When depositing only thin layers, naturally only very thin coatings attributable to the parasitic growth are observed on the process chamber walls. Their influence on the layer quality is acceptable. If in a generic apparatus, thick and in particular multi-layer structures are deposited, thick coatings are then formed on the process chamber walls. It has been observed that in the case of deposition of thick, in particular multi-layer structures, non-reproducible results come about in respect of layer quality.

It is an object of the invention to improve the known apparatus in such a way that thick multi-layer structures can be deposited reproducibly in process steps that follow one another directly and in particular, to provide measures by which changes in the temperature distribution within the process chamber during this process step are prevented.

The object is met by the method for equipping a process chamber specified in claim 1 and by the process chamber equipped in this way specified in claim 6.

The invention is based on the recognition that the layer growth and in particular the quality of the semiconductor layers deposited on the substrates depends not only on the surface kinetic but also on the gas phase kinetic. Decisive for the layer quality is therefore not only the actual pyrolytic decomposition process, preferably limited to the substrate surface. Rather pre-decomposition processes are important, and also the nucleation and adduct formation that follow these processes and take place in the gas phase above the substrate. By cooling the process chamber cover opposite the susceptor, the temperature distribution within the process chamber is to be adjusted. This latter is of major significance for the pre-decomposition of precursors introduced into the process chamber. Investigations and model calculations have shown that the temperature distribution within the process chamber and in particular on the susceptor depends not only on the power of the heater that heats the susceptor, but also on the radiation losses and the radiation properties of the walls that define the process chamber. It was found that the optical properties: reflectivity, absorptivity and transmissivity of the surfaces of the process chamber walls, are of decisive significance. According to the invention, these optical properties of the process chamber walls and in particular of the process chamber cover opposite the susceptor should be the same as those of the layer to be deposited. In the known apparatus, observed deficient reproducibility in the deposition of thick layers is in fact attributed to the optical properties of the process chamber cover changing during lengthier growth times. This has the result that the heat adsorbed by the process chamber cover during the process diminishes or increases and thereby the temperature of the process chamber cover changes, which has an effect on the temperature profile within the entire process chamber and thus also has an effect on the decomposition behavior and in particular the pre-decomposition behavior of the process gases. If the reflectivity changes, this has the result that a lesser or higher radiation power is reflected from the process chamber cover to the susceptor. This has not only the result that the temperature distribution within the process chamber changes. The change of the optical properties leads also to the surface temperature of the susceptor and in particular the surface temperature of the substrate during the duration of the process continually rising or continually falling, until the process chamber is coated uniformly with the decomposition products of the process gases. This is for instance the case when the layer thickness is thicker than twice the optical thickness, which corresponds to one quarter of the wavelength of the frequency of the radiation maximum for the process temperature. According to the invention, it is proposed to give at least the process chamber cover predetermined optical properties which correspond to those of the layer to be deposited and the coating that forms on the process chamber on account of parasitic growth. Relevant here are the optical properties in the frequency range in which the frequency maximum lies for the process temperatures (PLANCK's radiation law and WIEN's displacement law). The growth temperatures are in the range from 500 to 1,000° C.

An epitaxy reactor according to the prior art, the annular side wall of which and the cover of which opposite from the susceptor consists of stainless steel or aluminum, may as a result of the invention be retrofitted in simple manner. The side walls and the cover are provided with in particular exchangeable cladding pieces. These cladding pieces are made from a material which has optical properties that are substantially the same as or at least similar to the layer to be deposited. Depending on the material to be deposited within the process chamber, process chamber walls can be used that are adapted to the layers to be deposited in respect of their optical properties. If the semiconductor layers to be deposited are highly reflective but only slightly transparent, suitable cladding pieces have an almost mirrorlike surface and are not transparent. If the layers to be deposited are less transparent, so also are the cladding pieces. Typical values are: transmissivity T~0; absorptivity A~0.8; reflectivity R=1−A.

It is not necessary for the surface of the process chamber wall and in particular the surface of the process chamber cover to consist of the identical material as that from which the layer to be deposited in the respective process consists. According to the invention, a wall is to be formed such that it is very similar to the optical properties of the III-, V-semiconductor layer in the range of the process temperature, R+A+T being equal to 1. In this way, the heat exchange action with the process chamber does not change during coating of the process chamber.

Using the method according to the invention, a greater number of longer-duration deposition processes may also be carried out one after the other, without the process chamber having to be cleaned between the individual processes, i.e. when the substrates are exchanged.

All features disclosed are (in themselves) pertinent to the invention. The disclosure content of the associated/accompanying priority documents (copy of the prior application) is also hereby included in full in the disclosure of the application, including for the purpose of incorporating features of these documents in claims of the present application.

What is claimed is:

1. A method for equipping a process chamber in an apparatus for depositing at least one III-V semiconductor layer on a substrate held by a susceptor in the process chamber, process gases being introduced into the process chamber through a gas inlet element, in particular by means of a carrier gas, the process gases containing at least one organometallic compound of the Main Group III and a hydride of the Main Group V and decomposing into decomposition products in the process chamber, in particular on hot surfaces therein, the decomposition products comprising components that form the III-V semiconductor layer, the method characterized by selecting a material for a surface facing at least a wall of the process chamber that is opposite the susceptor, according to an optical reflectivity, optical absorptivity and optical transmissivity of said material, which reflectivity, absorptivity and transmissivity are the same as those of the layer to be deposited, and further selecting the material for the surface to be of a different material than the layer to be deposited.

2. A method according to claim 1, further characterized in that a surface of the susceptor and/or of a side wall also have optical properties that correspond to those of the layer.

3. A method according to claim 1, further characterized in that the susceptor is a base of the process chamber and the gas inlet element is disposed in a center of a process chamber cover.

4. A method according to claim 1, further characterized in that flow of the carrier gas and the process gases through the process chamber takes place in the horizontal direction.

5. A method according to claim 1, further characterized in that process chamber walls that are matched to optical properties of the layer to be deposited are exchangeable cladding pieces.

6. An apparatus for depositing a III-V semiconductor layer on a substrate held by a susceptor, in which process gases are introduced into a process chamber through a gas inlet element, in particular by means of a carrier gas, the process gases containing at least one organometallic compound of the Main Group III and at least one compound of the Main Group V and decomposing into decomposition products in the process chamber, in particular on hot surfaces therein, the decomposition products comprising components that form the III-V semiconductor layer, the apparatus characterized in that at least a wall of the process chamber opposite the susceptor is formed by an exchangeable cladding piece that has on its surface facing the process chamber an optical reflectivity, an optical absorptivity and an optical transmissivity which are the same as those of the III-V semiconductor layer to be deposited in the process chamber, and further selecting the material for the surface to be of a different material than the III-V semiconductor layer to be deposited.

7. An apparatus according to claim 6, further characterized in that the surface of the susceptor facing the process chamber and/or side walls facing the process chamber are formed by cladding pieces, surfaces of which facing the process chamber have properties that correspond to those of the III-V semiconductor layer to be deposited.

* * * * *